(12) United States Patent
Park et al.

(10) Patent No.: US 11,804,480 B2
(45) Date of Patent: Oct. 31, 2023

(54) INTEGRATED CIRCUIT CHIP INCLUDING STANDARD CELL

(71) Applicant: SAMSUNG ELECTRONICS CO., LTD., Suwon-si (KR)

(72) Inventors: Panjae Park, Seoul (KR); Byungju Kang, Seongnam-si (KR); Yoonjeong Kim, Seoul (KR); Kwanyoung Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 67 days.

(21) Appl. No.: 17/527,432

(22) Filed: Nov. 16, 2021

(65) Prior Publication Data

US 2022/0384415 A1 Dec. 1, 2022

(30) Foreign Application Priority Data

May 26, 2021 (KR) .................. 10-2021-0067361

(51) Int. Cl.
*H01L 27/02* (2006.01)
*H01L 27/092* (2006.01)
*H01L 27/118* (2006.01)
*H01L 29/08* (2006.01)
*H01L 29/78* (2006.01)
(Continued)

(52) U.S. Cl.
CPC ........ *H01L 27/0207* (2013.01); *H01L 27/092* (2013.01); *H01L 27/11807* (2013.01); *H01L 29/0847* (2013.01); *H01L 2027/11875* (2013.01); *H01L 2027/11881* (2013.01)

(58) Field of Classification Search
CPC .......... H01L 27/0207; H01L 27/11807; H01L 23/5386; H01L 27/092; H01L 29/0847; H01L 2027/11875; H01L 2027/11881; H01L 21/823871; H01L 23/5286; H01L 21/823878; H01L 29/0649; H01L 29/785; H01L 29/0673; H01L 29/42392; H01L 29/66439; H01L 29/775; H01L 29/78696; B82Y 10/00
See application file for complete search history.

(56) References Cited

U.S. PATENT DOCUMENTS 10,050,028 B2   8/2018   Peng et al.
10,146,900 B2   12/2018  Sahu et al.
(Continued)

*Primary Examiner* — Sonya McCall-Shepard
(74) *Attorney, Agent, or Firm* — Lee IP Law, P.C.

(57) ABSTRACT

An integrated circuit chip including a substrate including first and second element regions; a first channel active region extending in a first direction; a second channel active region; gate lines extending in a second direction and intersecting the first and second channel active regions; a diffusion break extending in the second direction; source/drain regions at opposite sides of the gate lines and on the first and second channel active regions; a first power line electrically connected to the source/drain regions; and a second power line electrically connected to the source/drain regions and having a lower voltage level than the first power line, wherein the diffusion break includes a first region including an insulator and overlapping the first element region, and a second region including a same material as the gate lines and overlapping the second element region, wherein the second region is electrically connected to the second power line.

20 Claims, 9 Drawing Sheets

(51) Int. Cl.
  *H01L 29/06* (2006.01)
  *H01L 29/423* (2006.01)
  *H01L 29/66* (2006.01)
  *H01L 21/8238* (2006.01)
  *H01L 29/775* (2006.01)
  *H01L 29/786* (2006.01)
  *H01L 23/528* (2006.01)
  *B82Y 10/00* (2011.01)

(56) References Cited

U.S. PATENT DOCUMENTS

| | | |
|---|---|---|
| 10,748,932 B2 | 8/2020 | Agarwal et al. |
| 10,777,640 B2 | 9/2020 | Chen et al. |
| 10,840,147 B1 | 11/2020 | Li et al. |
| 2016/0049395 A1* | 2/2016 | Okagaki ............... G06F 30/394 257/401 |
| 2016/0336183 A1* | 11/2016 | Yuan ................ H01L 27/0886 |
| 2019/0123140 A1 | 4/2019 | Park et al. |
| 2020/0020644 A1* | 1/2020 | Lee ....................... G06F 30/398 |
| 2020/0328205 A1 | 1/2020 | Alptekin et al. |

\* cited by examiner

INTEGRATED CIRCUIT CHIP INCLUDING STANDARD CELL

CROSS-REFERENCE TO THE RELATED APPLICATION

This application claims priority from Korean Patent Application No. 10-2021-0067361, filed on May 26, 2021, in the Korean Intellectual Property Office, the disclosure of which is incorporated herein by reference in its entirety.

BACKGROUND

1. Field

Embodiments relate to a semiconductor chip including a standard cell.

2. Description of the Related Art

An integrated circuit may include a plurality of standard cells. An integrated circuit may include standard cells providing the same function, and may include standard cells providing different functions. In addition, an integrated circuit may include standard cells providing different characteristics while providing the same function, and may include, e.g., standard cells selected on the basis of characteristics, e.g., operation speed, power consumption, area, or the like, from among a plurality of standard cells performing the same function. By virtue of advances in semiconductor processes, a standard cell having a reduced area may be provided, or a standard cell having a large area, which provides high current drivability to an integrated circuit manufactured using a given semiconductor process in order to satisfy desirable conditions, e.g., operation speed, may be needed.

SUMMARY

The embodiments may be realized by providing an integrated circuit chip including a substrate including a first element region and a second element region respectively including wells of different types; a first channel active region protruding from the first element region of the substrate and extending in a first direction; a second channel active region protruding from the second element region of the substrate and extending in the first direction; gate lines extending in a second direction intersecting the first direction and intersecting the first channel active region and the second channel active region; a diffusion break extending in the second direction; source/drain regions at opposite sides of each of the gate lines and on the first channel active region and the second channel active region, respectively; a first power line electrically connected to a part of the source/drain regions; and a second power line electrically connected to another part of the source/drain regions and having a lower voltage level than the first power line, wherein the diffusion break includes a first region including an insulator, the first region overlapping with the first element region, and a second region including a same material as the gate lines, the second region overlapping with the second element region, and wherein the second region is electrically connected to the second power line.

The embodiments may be realized by providing an integrated circuit chip including a substrate including a first element region and a second element region, which are constituted by wells of different types, respectively, and an active cut region separating the first element region and the second element region from each other; a front-end-of-line (FEOL) structure on the substrate; a back-end-of-line (BEOL) structure on the FEOL structure, the BEOL structure including a first power line, and a second power line having a lower voltage level than the first power line; and bumps on the BEOL structure, wherein the FEOL structure includes a first channel active region protruding from the first element region of the substrate and extending in a first direction when viewed in a plan view, a second channel active region protruding from the second element region of the substrate and extending in the first direction, gate lines extending in a second direction intersecting the first direction, the gate lines intersecting the first channel active region and the second channel active region, a diffusion break extending in the second direction, and source/drain regions at opposite sides of each of the gate lines and on the first channel active region and the second channel active region, respectively, and electrically connected to the first power line or the second power line, and wherein the diffusion break includes a first region including an insulator, the first region overlapping with the first element region, and a second region electrically connected to the second power line, the second region overlapping with the second element region.

The embodiments may be realized by providing an integrated circuit chip including standard cells, the integrated circuit chip including a substrate including a first element region including a P-type well, a second element region including an N-type well, and an active cut region separating the first element region and the second element region from each other; a first channel active region protruding from the first element region of the substrate and extending in a first direction; a second channel active region protruding from the second element region of the substrate and extending in the first direction; single diffusion breaks adjacent to boundaries of the standard cells, respectively, the single diffusion breaks extending in a second direction intersecting the first direction and overlapping with the first element region and the second element region; gate lines between the diffusion breaks, the gate lines extending in the second direction and intersecting the first channel active region and the second channel active region; source/drain regions at opposite sides of each of the gate lines and on the first channel active region and the second channel active region, respectively; a first power line electrically connected to a part of the source/drain regions; and a second power line electrically connected to another part of the source/drain regions and having a lower voltage level than the first power line, wherein each of the single diffusion breaks includes a first region including an insulator, the first region overlapping with the first element region, and a second region electrically connected to the second power line, the second region overlapping with the second element region and including a same material as the gate lines.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
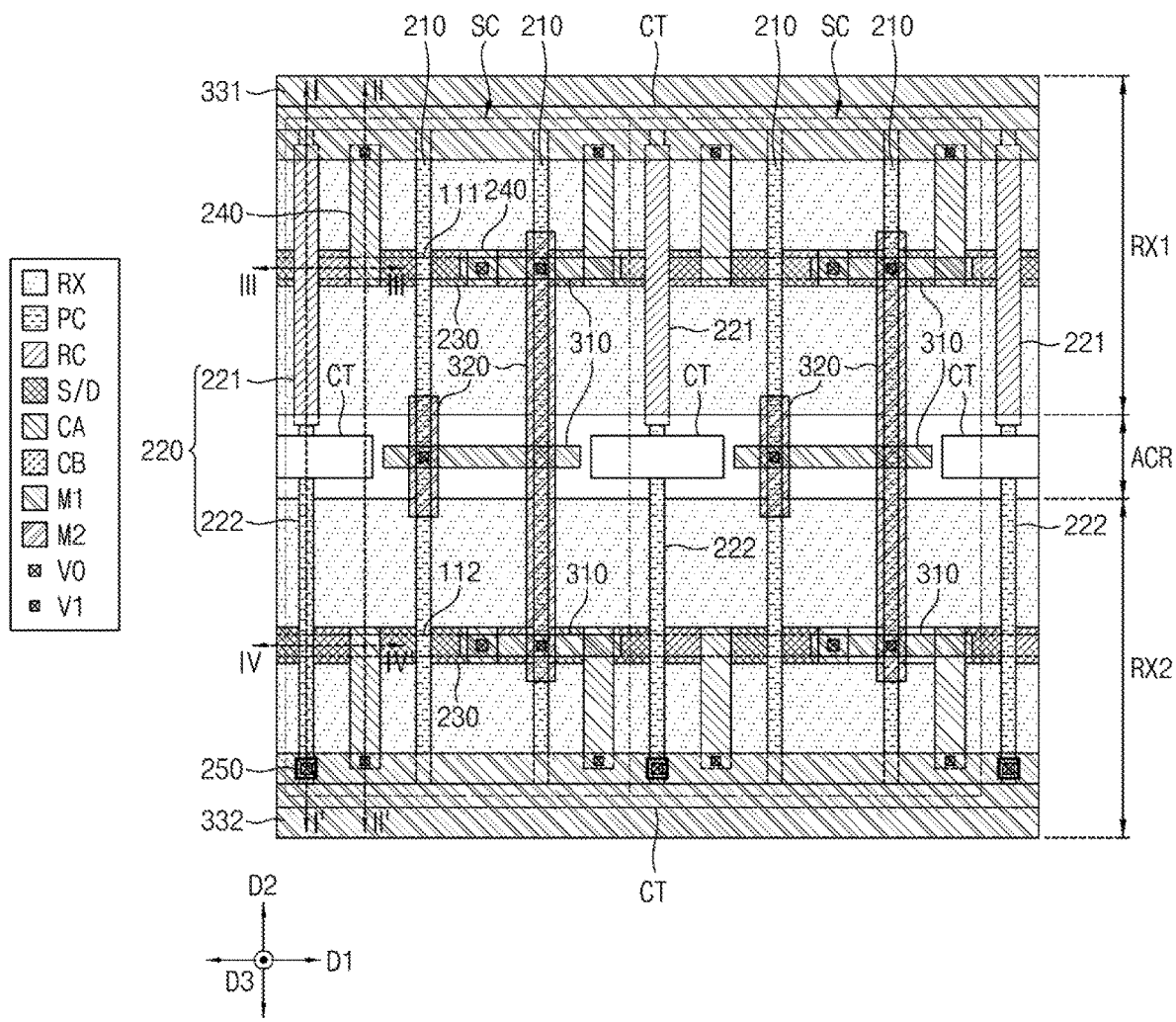
FIG. 1 is a layout view of an integrated circuit according to an exemplary embodiment of the disclosure.

FIG. 1 is a layout view of an integrated circuit according to an exemplary embodiment of the disclosure.

In the specification, a first direction D1 and a second direction D2 represent directions intersecting each other on a horizontal plane, respectively, and a third direction D3 represents a vertical direction. For example, the first direction D1 may correspond to an X-axis direction, the second direction D2 may correspond to a Y-axis direction, and the third direction D3 may correspond to a Z-axis direction. A plane extending in the first direction D1 and the second direction D2 may be a horizontal plane.

A standard cell SC may be a unit of a layout included in an integrated circuit chip, and may simply be referred to as a cell. The integrated circuit chip may include a plurality of various standard cells SC, and the standard cells SC may have a structure observing rules predetermined on the basis of a semiconductor process for manufacturing the integrated circuit chip. The standard cell SC may be a unit of an integrated circuit chip having a predetermined function while having a layout size satisfying a predetermined rule. In accordance with an embodiment, the standard cell SC may include an input pin and an output pin, and may process a signal received through the input pin and, as such, may output a resultant signal through the output pin. In an implementation, the standard cell SC may correspond to a basic cell such as AND, OR, NOR, an inverter, or the like, a complex cell such as OR/AND/INVERTER (OAI), AND/OR/INVERTER (AOI), or the like, and a storage element such as a simple master-slave flip-flop, a latch, or the like. In an implementation, the standard cell SC may have, e.g., a quadrangular shape.

Referring to FIG. 1, an integrated circuit chip may include a first-type well (e.g., a first element region RX1) extending (e.g., lengthwise) in the first direction D1 and having a predetermined width, and a second-type well (e.g., a second element region RX2) extending in the first direction D1 and having a predetermined width. In an implementation, the first-type well may be a well of a P type or an N type, and the second-type well may be a well of the other one of the P type or the N type. In an implementation, the first-type well and the second-type well may be alternately disposed while being adjacent to each other in the second direction D2. In an implementation, the first-type well and the second-type well may be formed at or on a substrate. The substrate may include a semiconductor, e.g., Si or Ge, or a compound semiconductor, e.g., SiGe, SiC, GaAs, InAs, or InP, and may include a conductive region, e.g., a well doped with impurities or a structure doped with impurities. In an implementation, widths of the first-type well and the second-type well (e.g., widths in the second direction D2) may be equal.

In an implementation, the first element region RX1 and the second element region RX2, in or on which a plurality of channel active regions 111 and 112 (or fin-type channel active regions) are formed, and an active cut region ACR (separating the first element region RX1 and the second element region RX2 from each other) may be defined. In an implementation, the first element region RX1 may correspond to the first-type well, and the second element region RX2 may correspond to the second-type well. The first element region RX1, the active cut region ACR, and the second element region RX2 may extend (e.g., lengthwise) in the first direction D1. The first element region RX1, the active cut region ACR, and the second element region RX2 may be arranged in or along the second direction D2.

The plurality of channel active regions 111 and 112 may extend in parallel in the first direction D1. The plurality of channel active regions 111 and 112 may be arranged (e.g., spaced apart) in the second direction D2. The plurality of channel active regions 111 and 112 may include a first channel active region 111 on the first element region RX1, and a second channel active region 112 on the second element region RX2.

The integrated circuit chip may include a first power line 331 to receive a first voltage and extending in the first direction D1, and a second power line 332 to receive a second voltage lower than the first voltage and extending in the first direction D1. In an implementation, the first voltage may be a positive voltage, and the second voltage may be a negative voltage or a ground voltage. The first power line 331 and the second power line 332 may be alternately disposed in the second direction D2 and may be spaced apart from each other by a uniform pitch or distance. The first power line 331 may be at one edge (e.g., an upper edge) of a standard cell SC, and the second power line 332 may be at the other edge (e.g., a lower edge) of the standard cell SC.

The integrated circuit chip may include a plurality of gate lines 210 extending in the second direction D2. Each gate line 210 may intersect the plurality of channel active regions 111 and 112. The standard cell SC may further include a transistor and additional patterns for routing in accordance with a desired function, on the basis of the structure of the integrated circuit chip. In an implementation, the gate lines 210 may have a shape in which the gate lines 210 extend in the second direction D2 within the standard cell SC. In an implementation, a part of the gate lines 210 may have, e.g., shapes separated in the second direction D2 through an etching process.

A pitch among the plurality of gate lines 210 may be referred to as 1 contacted poly pitch (CPP).

In an implementation, it may be appreciated that a standard cell may have a number of gate lines 210 different from the illustrated number. In an implementation, the gate line 210 may include a layer containing a work function metal and a gap-fill metal film. In an implementation, the layer containing the work function metal may include, e.g., Ti, W, Ru, Nb, Mo, Hf, Ni, Co, Pt, Yb, Tb, Dy, Er, or Pd, and the gap-fill metal film may be, e.g., a W film or an Al film. In an implementation, the gate lines 210 may include, e.g., a stack structure of TiAlC/TiN/W, a stack structure of TiN/TaN/TiAlC/TiN/W, or a stack structure of TiN/TaN/TiN/TiAlC/TiN/W. As used herein, the term "or" is not an exclusive term, e.g., "A or B" would include A, B, or A and B.

In an implementation, the channel active regions 111 and 112 of the standard cell SC may be terminated by a diffusion break (DB) 220. The diffusion break 220 may be included in order to help reduce influence between standard cells SC adjacent to each other, e.g., a local layout effect (LLE), and may isolate impurity-doped regions between the adjacent standard cells SC. A region of the diffusion break 220 may be filled with an insulator. In an implementation, the diffusion break 220 may only isolate fins between the adjacent cells or may isolate active regions and/or wells between the adjacent cells.

The diffusion break 220 may physically and/or electrically isolate the adjacent cells. The diffusion break 220 may be a single diffusion break or a double diffusion break.

In an implementation, the integrated circuit chip may include a single diffusion break as a diffusion break 220 adjacent to one side (e.g., a left side or a right side in the drawing) of the standard cell SC. The width (e.g., the length in the first direction D1) of the single diffusion break 220 may be substantially equal to the width of the gate line 210. In an implementation, when a single diffusion break is used as the diffusion break 220, the width of the diffusion break 220 may be smaller than 1 CPP.

When the standard cell SC is manufactured using a single diffusion break method, one or two gate lines 210, which are at an outermost side from among the plurality of gate lines 210, may be deformed to function as the diffusion break 220. In an implementation, the diffusion break 220 may be formed by deforming one gate line 210 at one outer side (e.g., the left side in the drawing) from among the plurality of gate lines 210. Accordingly, the diffusion break 220 may include the same material as the gate lines 210 in a region thereof. In an implementation, the region of the diffusion break 220 may be a dummy gate line. The diffusion break 220 may be formed by removing the gate line 210 previously formed in a region corresponding to another region of the diffusion break 220, and filling the region with an insulator. In an implementation, the diffusion break 220 may be formed at the same level as the gate lines 210. In an implementation, pitches among the diffusion break 220 and the gate lines 210 may be equal. In an implementation, the spacing between the diffusion break 220 and the gate line 210 adjacent thereto and the spacing between adjacent ones of the gate lines 210 may be substantially equal.

The diffusion break 220 may include a first region 221 and a second region 222 which include different materials, respectively. Both the first region 221 and the second region 222 may be within one standard cell SC. The first region 221 and the second region 222 may be on one virtual line (straight line) extending in the second direction D2 (e.g., the first region 221 and the second region 222 may be linearly aligned along the second direction D2). The first region 221 and the second region 222 may have pattern shapes extending in the second direction D2, respectively, and may be adjacent to each other in the second direction D2. In an implementation, the first region 221 and the second region 222 may be separated (e.g., spaced apart) from each other by a gate cut region CT. In an implementation, the first region 221 and the second region 222 may be physically separated from each other. Accordingly, each length of the first region 221 and the second region 222 may be smaller than the length of at least a part of the gate lines 210 in the same standard cell SC.

In an implementation, the first region 221 may be on the first element region RX1 (e.g., in an overlapped state). In the specification, when an element or layer is described as being positioned "on" another element or layer, this description should be construed as including not only the case in which the elements or layers directly contact each other, but also the case in which an intermediate element or layer is therebetween. The first region 221 may divide the first channel active region 111, which extends in the first direction D1 while intersecting the first region 221, with respect to a boundary formed by the first region 221. The first region 221 may physically divide the first channel active region 111. The first region 221 may include at least a portion where no gate line 210 is formed. The at least a portion of the first region 221 may be filled with an insulator. Accordingly, the first region 221 may substantially prevent flow of current therethrough.

In an implementation, the first channel active region 111 may be removed at a portion thereof intersecting the first region 221. In an implementation, the first region 221 of the diffusion break 220 may not overlap with the first channel active region 111. The first channel active region 111 extending in the first direction D1 may be divided by the first region 221 of the diffusion break 220. In an implementation, the first channel active region 111 extending in the first direction D1 may intersect the gate lines 210 while overlapping with the gate lines 210.

In an implementation, the gate lines 210 that are not removed may be in the vicinity of the first region 221. In an implementation, the same material as the gate lines 210 may contact an outer side of the first region 221. In an implementation, the same material as the gate lines 210 contacting the outer side of the first region 221 may be omitted. In this case, the first region 221 may directly contact a first interlayer insulating film 161 (cf. FIG. 2) (or the gate cut region CT (cf. FIG. 1)).

In an implementation, the second region 222 may be on the second element region RX2 (e.g., in an overlapped state). The second region 222 may include the same material as the gate lines 210. The second region 222 may be electrically connected to the second power line 332. In an implementation, the second region 222 may have the voltage level of the second voltage. Accordingly, the second region 222 may divide the second channel active region 112, which extends in the first direction D1 while intersecting the second region 222, with respect to a boundary formed by the second region 222. The second region 222 may electrically divide the second channel active region 112 with respect to the boundary formed by the second region 222. As described above, the second region 222 may be referred to as a dummy gate line.

In an implementation, the first channel active region 111 may be of a P type, and the second channel active region 112 may be of an N type. The first region 221 of the diffusion break 220 may physically divide the first channel active region 111 of the P type, and the second region 222 may electrically divide the second channel active region 112 of the N type.

Source/drain regions 230 may be at opposite sides of one gate line 210. The source/drain region 230 may be between the adjacent gate lines 210 or between the diffusion break 220 and the gate line 210 adjacent thereto. The source/drain regions 230 may overlap with the first channel active region 111 and the second channel active region 112. In an implementation, the source/drain region 230 may be constituted by an impurity ion implantation region at a portion of each of the first channel active region 111 and the second channel active region 112, an epitaxial layer epitaxially grown from a recess region formed at each of the channel active regions 111 and 112, or a combination thereof.

First contact electrodes 240 may overlap with a part of the source/drain regions 230 at respective portions thereof. The first contact electrodes 240 may be electrically connected to the source/drain regions 230. In an implementation, the first contact electrodes 240 may directly contact the source/drain regions 230.

Second contact electrodes 250 each may overlap with a portion of the diffusion break 220. The second contact electrode 250 may be electrically connected to the diffusion break 220. In an implementation, the second contact electrode 250 may contact the second region 222 of the diffusion break 220.

A first wiring pattern 310 may overlap with a part of the first contact electrodes 240 at portions thereof. The first wiring pattern 310 may be electrically connected to the part of first contact electrodes 240 through a first via V0.

The first power line 331 and the second power line 332 may overlap with portions of the gate lines 210 and portions of the first contact electrodes 240, and the second contact electrodes 250. The first power line 331 and the second power line 332 may be electrically connected to parts of the first contact electrodes 240, respectively.

In an implementation, the first power line 331 may overlap with a portion of the first region 221 of the diffusion break 220. The first power line 331 and the first region 221 of the diffusion break 220 may be electrically insulated from each other.

In an implementation, the second power line 332 may overlap with a portion of the second region 222 of the diffusion break 220. The second power line 332 may be electrically connected to the second contact electrodes 250 via the first via V0, and the second contact electrodes 250 may contact the second region 222 of the diffusion break 220. In an implementation, the second power line 332 and the second region 222 of the diffusion break 220 may be electrically interconnected.

In an implementation, the first wiring pattern 310, the first power line 331 and the second power line 332 may be formed at or on the same layer. The first wiring pattern 310, the first power line 331, and the second power line 332 may include the same material.

Second wiring patterns 320 may overlap with a part of the first wiring patterns 310 at portions thereof. A second via V1 may be formed in regions where the first wiring patterns 310 and the second wiring patterns 320 overlap each other and, as such, the first wiring patterns 310 and the second wiring patterns 320 may be electrically interconnected through the second via V1.

A plurality of gate cut regions CT may overlap with the first power line 331, the second power line 332, and the active cut region ACR. A part of the gate cut regions CT may have a shape extending in the first direction D1 while overlapping with the first power line 331 and the second power line 332. The part of gate cut regions CT may overlap with one edge (e.g., an upper edge) and the other edge (e.g., the lower edge) of the standard cell SC. The gate cut regions CT overlapping with the active cut region ACR may be between the first region 221 and the second region 222 of the diffusion break 220. In an implementation, the gate cut regions CT overlapping with the active cut region ACR may divide a part of the gate lines 210 extending in the second direction D2.

Figure 2:
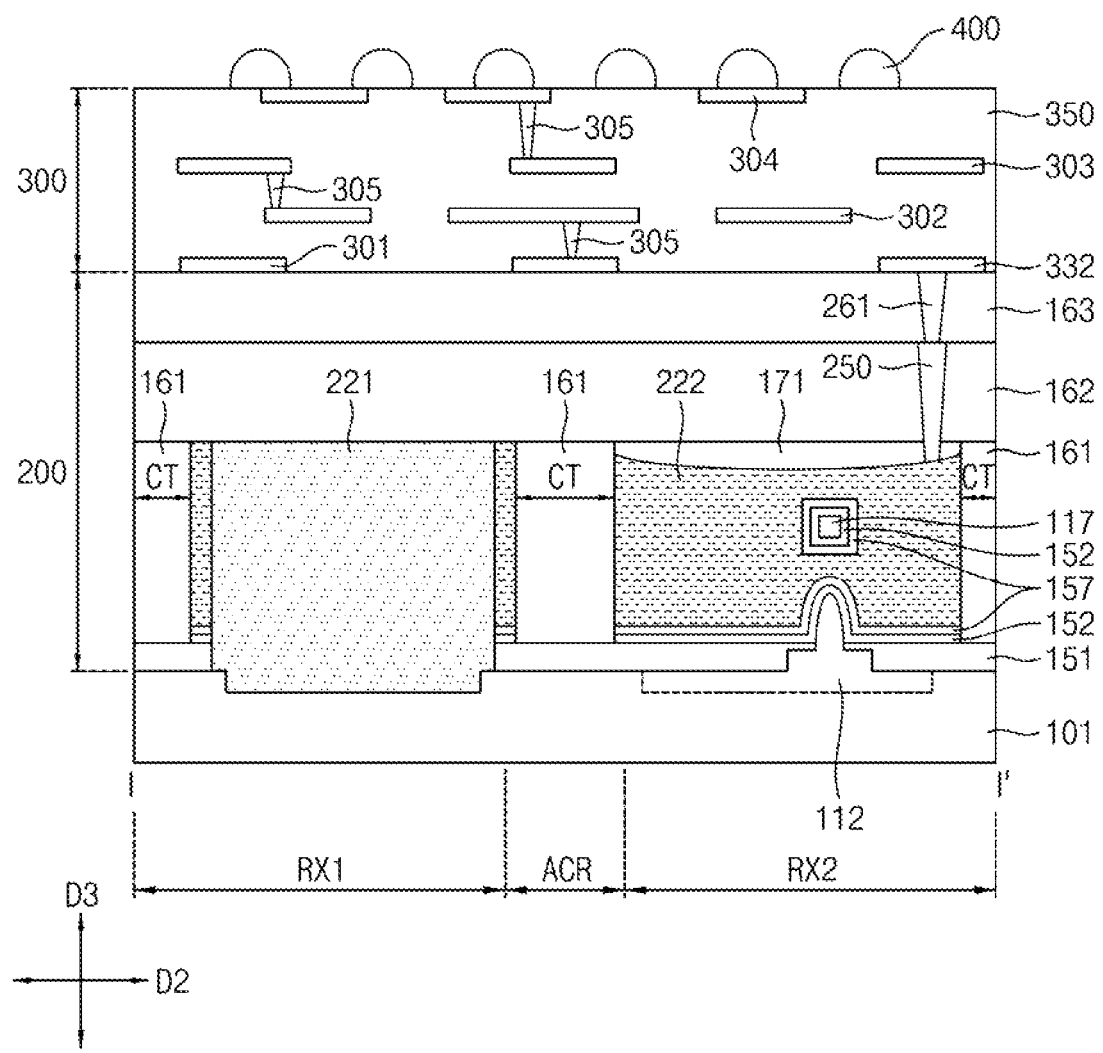
FIG. 2 is a cross-sectional view of the integrated circuit chip taken along line I-I' in FIG. 1.
Figure 3:
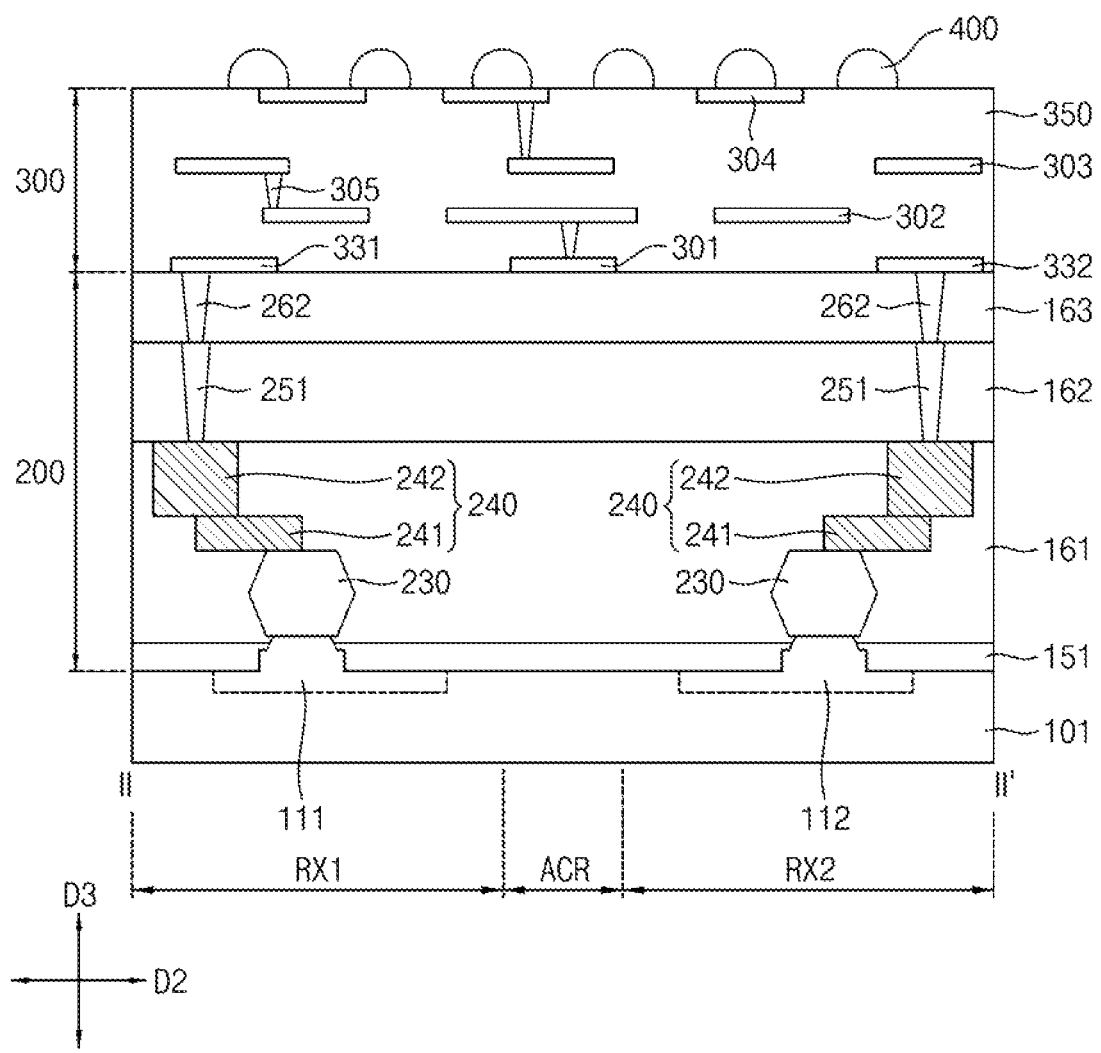
FIG. 3 is a cross-sectional view of the integrated circuit chip taken along line II-II' in FIG. 1.
Figure 4:
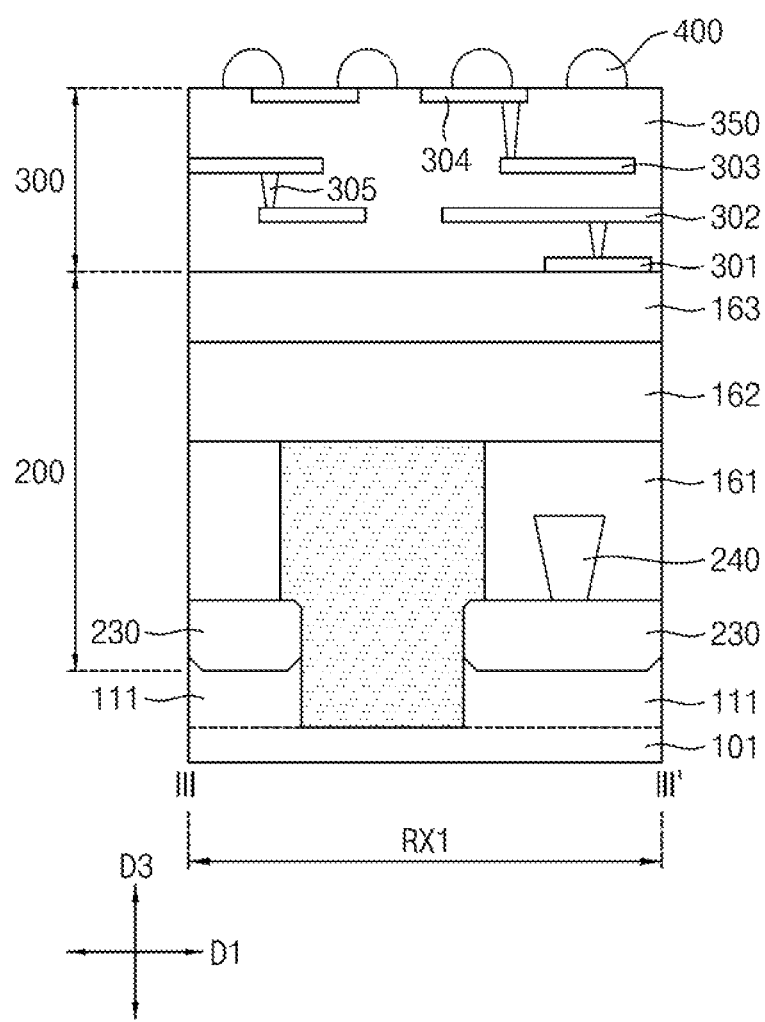
FIG. 4 is a cross-sectional view of the integrated circuit chip taken along line in FIG. 1.
Figure 5:
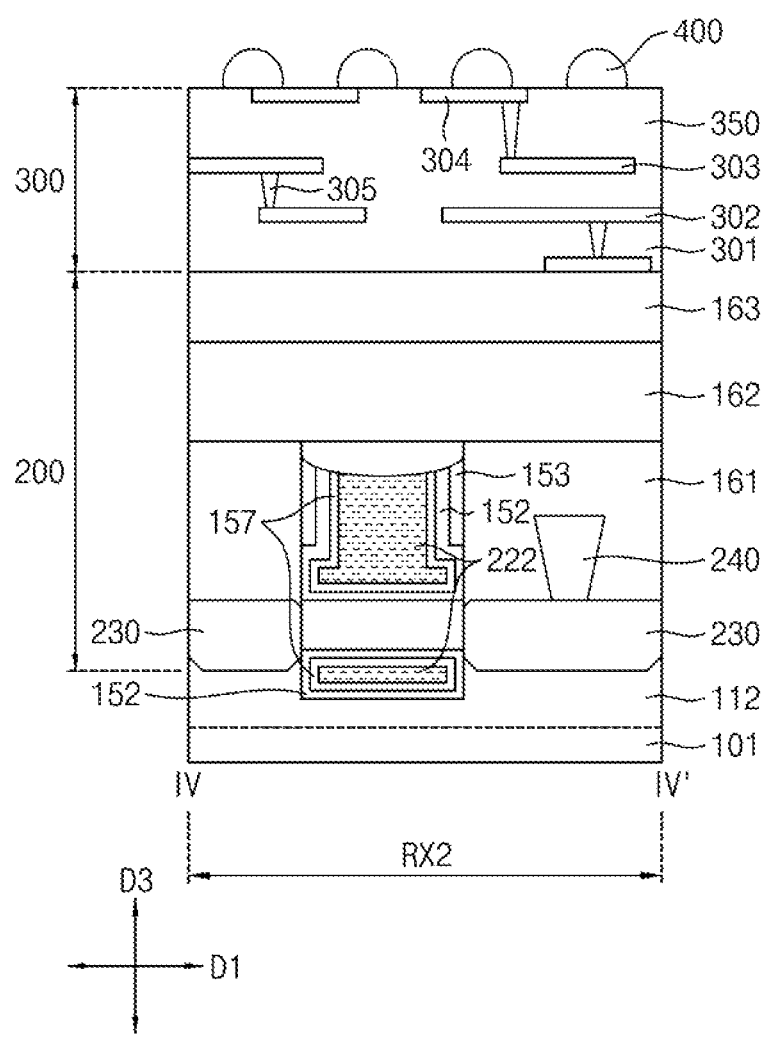
FIG. 5 is a cross-sectional view of the integrated circuit chip taken along line IV-IV' in FIG. 1.

FIG. 2 is a schematic cross-sectional view of the integrated circuit chip taken along line I-I' in FIG. 1. FIG. 3 is a schematic cross-sectional view of the integrated circuit chip taken along line II-IF in FIG. 1. FIG. 4 is a schematic cross-sectional view of the integrated circuit chip taken along line in FIG. 1. FIG. 5 is a schematic cross-sectional view of the integrated circuit chip taken along line IV-IV' in FIG. 1.

Referring to FIGS. 1 to 5, a substrate 101 may include channel active regions 111 and 112 protruding upwardly from one surface (e.g., an active surface) of the substrate 101. In FIG. 2, only the second channel active region 112 is illustrated. In an implementation, the channel active regions 111 and 112 may protrude from the substrate 101 in the third direction D3. The channel active regions 111 and 112 may include a conductive region, e.g., a well doped with impurities or a structure doped with impurities. In an implementation, the doped conductive region may be the above-described first-type well region or the above-described second-type well region.

A front-end-of-line (FEOL) structure 200 may be on the substrate 101. The FEOL structure 200 may be formed by an FEOL process. The FEOL process may refer to a process for forming individual elements, e.g., a transistor, a capacitor, a resistor, or the like, on the substrate 101 in a manufacturing procedure for the integrated circuit chip. In an implementation, the FEOL process may include planarization and cleaning of a wafer, formation of a trench, formation of a well, formation of a gate line, formation of a source and drain, or the like.

In an implementation, the FEOL structure 200 may constitute a logic cell including a multi-bridge channel FET (MBCFET). In an implementation, the FEOL structure 200 may constitute a logic cell including a metal-oxide-semiconductor field effect transistor (MOSFET), a fin field effect transistor (FinFET). a system large scale integration (LSI) device, a microelectromechanical system (MEMS), an active device, or a passive device which includes a plurality of transistors.

The integrated circuit chip may include a lower insulating film 151 on the substrate 101. The lower insulating film 151 may have a predetermined thickness on or at opposite side portions of the channel active regions 111 and 112 and on the substrate 101. The lower insulating film 151 may surround parts of the channel active regions 111 and 112. The lower insulating film 151 may include an insulating material. In an implementation, the lower insulating film 151 may include silicon oxide, silicon nitride, or silicon oxynitride.

A protrusion height of the channel active regions 111 and 112 may be greater than the thickness of the lower insulating film 151. In an implementation, the channel active regions 111 and 112 may have a shape protruding from the lower insulating film 151 and extending through the lower insulating film 151.

In an implementation, the channel active regions 111 and 112 may be a semiconductor pattern including a semiconductor material, similarly to the material of the substrate 101.

In an implementation, the channel active regions 111 and 112 may include a lower pattern including a semiconductor material, similarly to the material of the substrate 101, and an upper pattern including an insulating material.

A gate insulating film 152 may be on a portion of the lower insulating film 151. In addition, the gate insulating film 152 may be on the channel active regions 111 and 112. The gate insulating film 152 may be, e.g., a silicon oxide film, a high-k dielectric film, or a combination thereof. The gate insulating film 152 may be formed by, e.g., an atomic layer deposition (ALD) process, a chemical vapor deposition (CVD) process or a physical vapor deposition (PVD) process.

The second region 222 of the diffusion break 220 or the gate lines 210 may be on the gate insulating film 152. Cross-sectional shapes of the second region 222 of the diffusion break 220 and the gate lines 210 may be substantially the same. The following description will be given in conjunction with the second region 222 of the diffusion break 220 including the gate line 210, and the description of the second region 222 of the diffusion break 220 may be equivalently applied to the cross-sectional shape of the gate line 210 at a position different from that of the second region 222.

The second region 222 may be on the gate insulating film 152. In an implementation, the second region 222 may have a structure in which a metal nitride film, a metal layer, a conductive capping layer, and a gap-fill metal film are sequentially stacked.

The second region 222 may include a metal layer 157. The metal layer 157 may be for adjusting a work function. The metal layer 157 may be formed not only along a lower portion of the second region 222, but also along a top surface of the lower insulating film 151 and an upper portion of the second channel active region 112. In an implementation, the metal layer 157 may include, e.g., TiN, WN, TaN, Ru, TiC, TaC, Ti, Ag, Al, TiAl, TiAlN, TiAlC, TaCN, TaSiN, Mn, or Zr.

A wire pattern 117 may extend through an inside of each second region 222. In an implementation, the wire pattern 117 may be on the substrate 101, and may extend in the first direction D1. The wire pattern 117 may overlap with the channel active regions 111 and 112. In an implementation, a width of the wire pattern 117 may be equal to the width of the channel active regions 111 and 112.

The wire pattern 117 may be a part of constituent elements constituting the channel active regions 111 and 112. In an implementation, the wire pattern 117 may not be formed on the lower insulating film 151, but may be formed on the channel active regions 111 and 112. The wire pattern 117 may be a channel region. The function and material of the wire pattern 117 may be varied in accordance with whether the integrated circuit chip is of a PMOS type or an NMOS type.

The gate insulating film 152 may also be between the wire pattern 117 and the second region 222. The gate insulating film 152 may be conformally formed along a periphery of the wire pattern 117. A part of the metal layer 157 may be between the gate insulating film 152 and the wire pattern 117.

In an implementation, the integrated circuit chip may include a negative capacitance (NC) FET using a negative capacitor. In an implementation, the gate insulating film 152 may include a ferroelectric material film having ferroelectric characteristics, and a paraelectric material film having paraelectric characteristics.

The ferroelectric material film may have a negative capacitance, and the paraelectric material film may have a positive capacitance. In an implementation, when two or more capacitors are connected in series, and the capacitance of each of the capacitors has a positive value, the total capacitance of the capacitors may be lower than the capacitance of each individual capacitor. In an implementation, when at least one of the capacitances of two or more capacitors connected in series has a negative value, the total capacitance of the capacitors may have a positive value and may be greater than an absolute value of the capacitance of each individual capacitor.

When a ferroelectric material film having a negative capacitance and a paraelectric material film having a positive capacitance are connected in series, the total capacitance of the ferroelectric material film and the paraelectric material film connected in series may increase. A transistor including a ferroelectric material film may have subthreshold swing (SS) of less than 60 mV/decade at normal temperature, using an increase in total capacitance as described above.

The ferroelectric material film may have ferroelectric dielectric characteristics. The ferroelectric material film may include, e.g., hafnium oxide, hafnium zirconium oxide, barium strontium titanium oxide, barium titanium oxide, or lead zirconium titanium oxide. In an implementation, hafnium zirconium oxide may be a material produced by doping hafnium oxide with zirconium (Zr). In an implementation, hafnium zirconium oxide may include, e.g., a compound of hafnium (Hf), zirconium (Zr), and oxygen (O).

The ferroelectric material film may further include a dopant doped therein. In an implementation, the dopant may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The kind of the dopant included in the ferroelectric material film may be varied in accordance with which ferroelectric material is included in the ferroelectric material film.

When the ferroelectric material film includes hafnium oxide, the dopant included in the ferroelectric material film may include, e.g., gadolinium (Gd), silicon (Si), zirconium (Zr), aluminum (Al), or yttrium (Y).

When the dopant is aluminum (Al), the ferroelectric material film may include 3 to 8 atomic % (at %) of aluminum. In an implementation, the ratio of the dopant may be the ratio of aluminum to the sum of hafnium and aluminum.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may include 1 to 7 at % of gadolinium. When the dopant is zirconium (Zr), the ferroelectric material film may include 50 to 80 at % of zirconium.

The paraelectric material film may have paraelectric characteristics. The paraelectric material film may include, e.g., silicon oxide or a metal oxide having a high dielectric constant. In an implementation, the metal oxide included in the paraelectric material film may include, e.g., hafnium oxide, zirconium oxide, or aluminum oxide.

The ferroelectric material film and the paraelectric material film may include the same material. The ferroelectric material film has ferroelectric characteristics, but the paraelectric material film may not have ferroelectric characteristics. In an implementation, when both the ferroelectric material film and the paraelectric material film include hafnium oxide, the crystalline structure of the hafnium oxide included in the ferroelectric material film may differ from the crystalline structure of the hafnium oxide included in the paraelectric material film.

The ferroelectric material film may have a thickness exhibiting ferroelectric characteristics. In an implementation, the thickness of the ferroelectric material film may be, e.g., 0.5 to 10 nm. The critical thickness exhibiting ferroelectric characteristics may be varied in accordance with different ferroelectric materials and, as such, the thickness of the ferroelectric material film may be varied in accordance with the ferroelectric material thereof.

In an implementation, the gate insulating film 152 may include one ferroelectric material film. In an implementation, the gate insulating film 152 may include a plurality of ferroelectric material films spaced apart from one another. In this case, the gate insulating film 152 may have a stacked film structure in which a plurality of ferroelectric material films and a plurality of paraelectric material films are alternately stacked.

A spacer 153 may surround side portions of the second region 222 and the gate insulating film 152. In an implementation, the spacer 153 may be omitted from a predetermined region.

A gate capping layer 171 may be on the second region 222. In an implementation, the gate capping layer 171 may be omitted, or the gate capping layer 171 may be removed only from a region in which the second contact electrode 250 will be formed in order to connect the gate lines 210 to a structure thereover.

A combination of the gate insulating film 152, the metal layer 157, the second region 222 (or the gate lines 210), the gate capping layer 171, and the spacer 153 may refer to a gate structure.

The first interlayer insulating film 161 may be between gate structures. In an implementation, the first interlayer insulating film 161 may be between the gate structures in regions other than the gate cut regions CT while filling the gate cut regions CT.

In an implementation, the first interlayer insulating film 161 may be, e.g., a silicon oxide film, a silicon nitride film, a silicon oxynitride film, or a combination thereof. In an implementation, a material filling the gate cut regions CT and a material between the gate structures in regions other than the gate cut regions CT may be distinguished from each other. In this case, the material filling the gate cut regions CT may include, as a filling material, SiN or the like, distinguished from the regions other than the gate cut regions CT.

The source/drain region 230 may be on the other portion of each of the channel active regions 111 and 112. The source/drain region 230 may be on the lower insulating film 151. In an implementation, the source/drain region 230 may be directly formed at an upper portion of each of the channel active regions 111 and 112. In an implementation, one source/drain region 230 may be on the two or more channel active regions 111 and 112 such that the source/drain region 230 directly contacts the channel active regions 111 and 112. The source/drain region 230 may vertically overlap with the channel active regions 111 and 112. The source/drain region 230 may be on a protruding end of the channel active regions 111 and 112. The source/drain region 230 may include a semiconductor material or a dopant atom (e.g., a B, P, or As atom).

The first contact electrode 240 may be directly on the source/drain region 230. In an implementation, the first contact electrode 240 may include a tall section 242 and a short section 241. The short section 241 may directly contact the source/drain region 230. The tall section 242 may be directly on the short section 241 and, as such, may directly contact a first via 251 ("V0" in FIG. 1). The height (e.g., in the third direction D3) of the tall section 242 may be greater than the height of the short section 241. Portions of the first contact electrode 240 may be covered by the first interlayer insulating film 161.

A second interlayer insulating film 162 (covering the gate structures) may be on the first interlayer insulating film 161. In an implementation, a top surface of the second interlayer insulating film 162 may be flat. In an implementation, the second interlayer insulating film 162 may be, e.g., a silicon oxide film, a silicon nitride film, a silicon oxynitride film, or a combination thereof.

The second contact electrode 250 may contact the second region 222 (or the gate lines 210) while extending through the second interlayer insulating film 162 and the gate capping layer 171.

The first via 251 may contact the first contact electrode 240 while extending through the second interlayer insulating film 162.

A third interlayer insulating film 163 may be on the second interlayer insulating film 162. The third interlayer insulating film 163 may cover the second interlayer insulating film 162. A top surface of the third interlayer insulating film 163 may be flat. The third interlayer insulating film 163 may be constituted by, e.g., a silicon nitride film.

A first connecting electrode 261 contacting the second contact electrode 250 and a second connecting electrode 262 contacting the first via 251 may be at or in the third interlayer insulating film 163. Each of the first connecting electrode 261 and the second connecting electrode 262 may extend through the third interlayer insulating film 163 in a vertical direction (the third direction D3). The first connecting electrode 261 and the second connecting electrode 262 may be connected to a plurality of wirings 301, 331 and 332 of a back-end-of line (BEOL) structure 300. In an implementation, the first connecting electrode 261 may be connected to the second power line 332 which is formed at the BEOL structure 300. The second connecting electrode 262 may be connected to the first power line 331, which is formed at the BEOL structure 300, or the second power line 332. In an implementation, the third interlayer insulating film 163, the first connecting electrode 261, or the second connecting electrode 262 may be omitted.

The structure stacked on the substrate 101 (e.g., from the lower insulating film 151 up to the third interlayer insulating film 163) may refer to the FEOL structure 200.

The BEOL structure 300 may be on the FEOL structure 200. The BEOL structure 300 may be formed through a BEOL process. The BEOL process may refer to a process for interconnecting individual elements, for example, a transistor, a capacitor, a resistor, or the like, in a manufacturing procedure for an integrated circuit chip. In an implementation, the BEOL process may include silicidation of a region where a gate is formed and a source/drain region, addition of dielectrics, planarization, formation of a hole, addition of a metal layer, formation of a contact plug, formation of a passivation layer, or the like. In an implementation, the integrated circuit chip may be packaged in a semiconductor package after execution of the BEOL process and, as such, may be used as an element for various applications.

The BEOL structure 300 may include a plurality of multilayer wiring structures electrically connected to the FEOL structure 200, and a fourth interlayer insulating film 350 for mutually insulating a part of the plurality of multilayer wiring structures. The fourth interlayer insulating film 350 may cover the FEOL structure 200. In an implementation, the fourth interlayer insulating film 350 may be constituted by, e.g., a silicon oxide film, a silicon nitride film, a silicon oxynitride film, or a combination thereof. In an implementation, a part of layers constituting the fourth interlayer insulating film 350 may be a passivation layer.

In an implementation, the plurality of multilayer wiring structures may include first to fourth wiring layers 301 to 304 each including a plurality of wirings, and a plurality of vias 305 interconnecting the plurality of wirings between adjacent ones of the plurality of wiring layers 301 to 304. In an implementation, the plurality of multilayer wiring structures may be formed with wiring layers such that the each of the plurality of multilayer wiring structures has greater than four stories or levels. In an implementation, the stack number of a plurality of wiring layers sequentially stacked in a vertical direction in each of the plurality of multilayer wiring structures may be diversely selected.

Each of the first to fourth wiring layers 301 to 304 may be patterned in a horizontal direction (the first direction D1 or the second direction D2). The plurality of vias 305 may be formed in a vertical direction (the third direction D3).

In an implementation, the first wiring layer 301 (e.g., "M1" in FIG. 1) may include the first power line 331, the second power line 332 and the first wiring pattern 310. In an implementation, the second wiring layer 302 (e.g., "M2" in FIG. 1) may include the second wiring pattern 320.

In an implementation, bumps 400 may be on the BEOL structure 300. The bumps 400 may be electrically connected to at least a part of the plurality of wirings in the BEOL structure 300. In an implementation, the bumps 400 may include chromium/chromium-copper alloy/copper (Cr/Cr-Cu/Cu), titanium-tungsten alloy/copper (Ti—W/Cu), aluminum/nickel/copper (Al/Ni/Cu), or nickel. The bumps 400 may be formed through sputtering, electroplating, or electroless plating.

Hereinafter, an integrated circuit chip according to another exemplary embodiment of the disclosure will be described. In the following description, a repeated description of constituent elements identical to those of FIG. 1 may be omitted, and the constituent elements will be designated by reference numerals identical or similar to those of FIG. 1.

Figure 6:
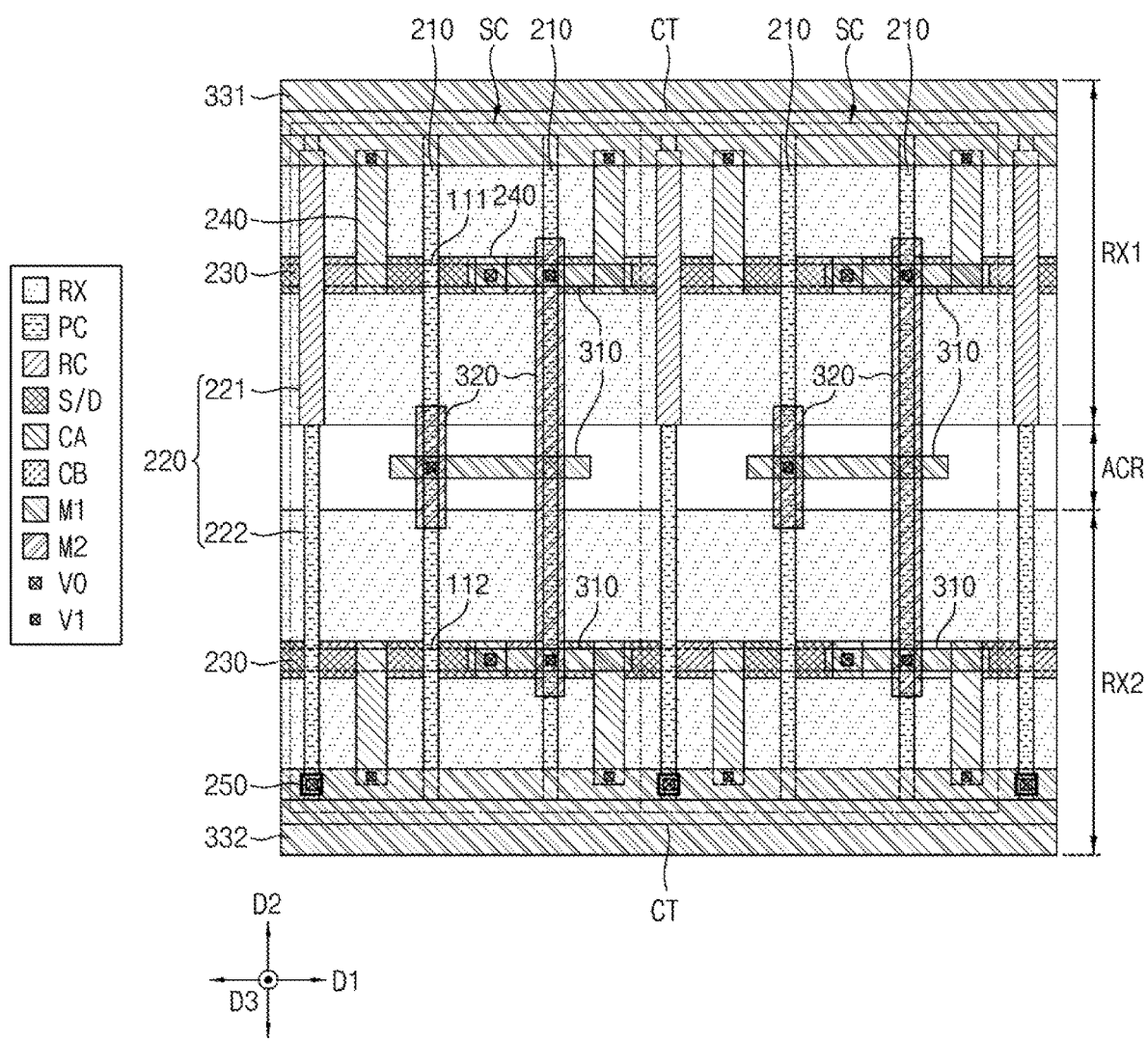
FIG. 6 is a layout view of an integrated circuit chip according to an exemplary embodiment of the disclosure.

FIG. 6 is a layout view of an integrated circuit chip according to an exemplary embodiment of the disclosure.

Referring to FIG. 6, the integrated circuit chip according to this embodiment differs from the integrated circuit chip according to the embodiment of FIG. 1 in that a gate cut region (cf. "CT" in FIG. 1) dividing a diffusion break 220 in the same standard cell SC is omitted.

In an implementation, a first region 221 and a second region 222 of the diffusion break 220 may be interconnected, e.g., without being separated or spaced apart from each other. The first region 221 and the second region 222 may be continuously disposed in a second direction D2. In an implementation, the second region 222 may extend on both a second element region RX2 and an active cut region ACR.

Figure 7:
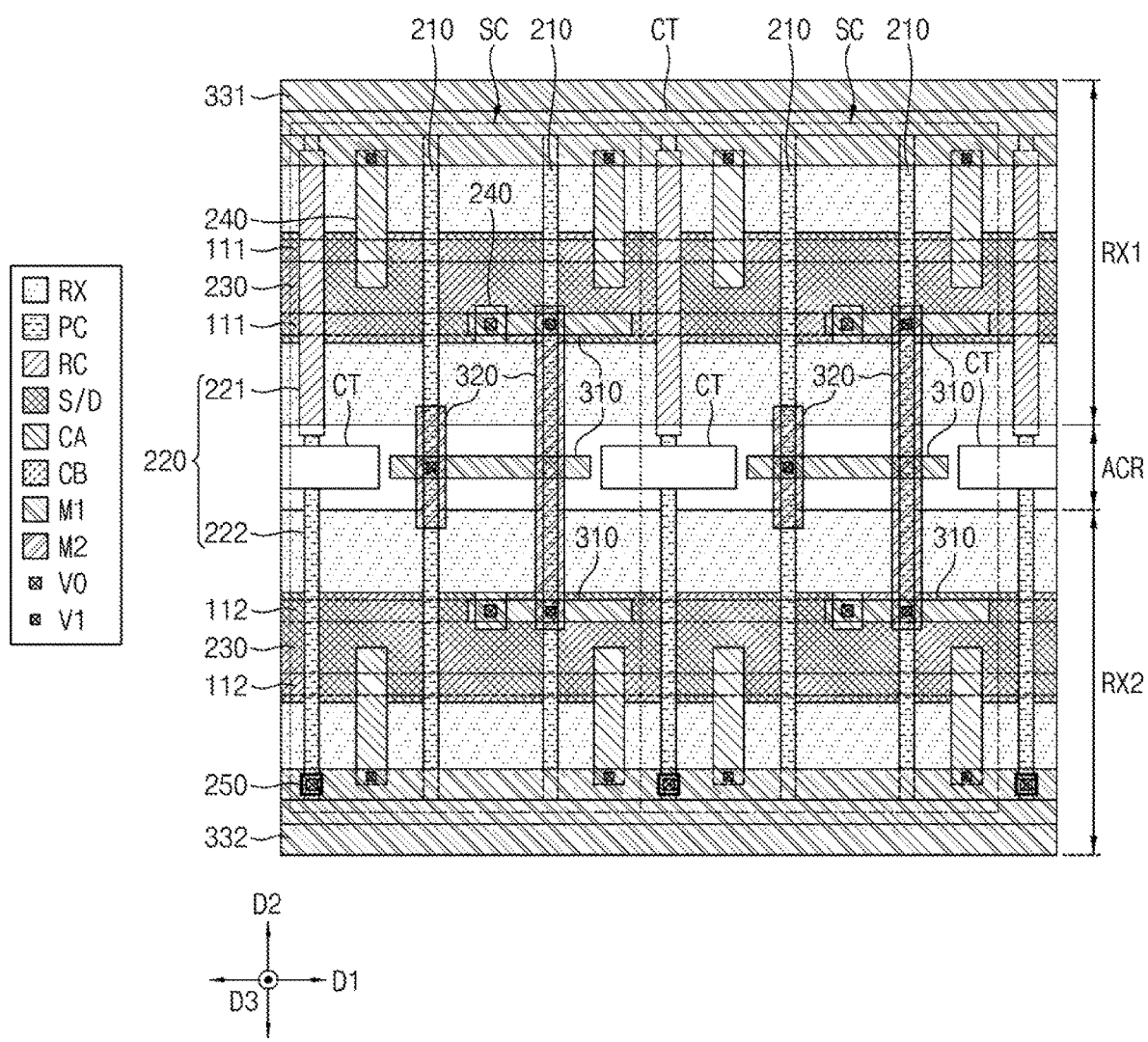
FIG. 7 is a layout view of an integrated circuit chip according to an exemplary embodiment of the disclosure.

FIG. 7 is a layout view of an integrated circuit chip according to an exemplary embodiment of the disclosure.

Referring to FIG. 7, the integrated circuit chip according to the present embodiment differs from the integrated circuit chip according to the embodiment of FIG. 1 in that each of channel active regions 111 and 112 has a double fin-type structure.

In an implementation, each of the channel active regions 111 and 112 may be of a double fin type. In an implementation, each of the channel active regions 111 and 112 may have a shape in which two fins extend in a first direction D1 while being spaced apart from each other in a second direction D2.

In an implementation, a source/drain region 230 may overlap with both fins of each of the channel active regions 111 and 112. In an implementation, one source/drain region 230 may overlap with both fins of the double fin-type structure of each of the channel active regions 111 and 112.

Figure 8:
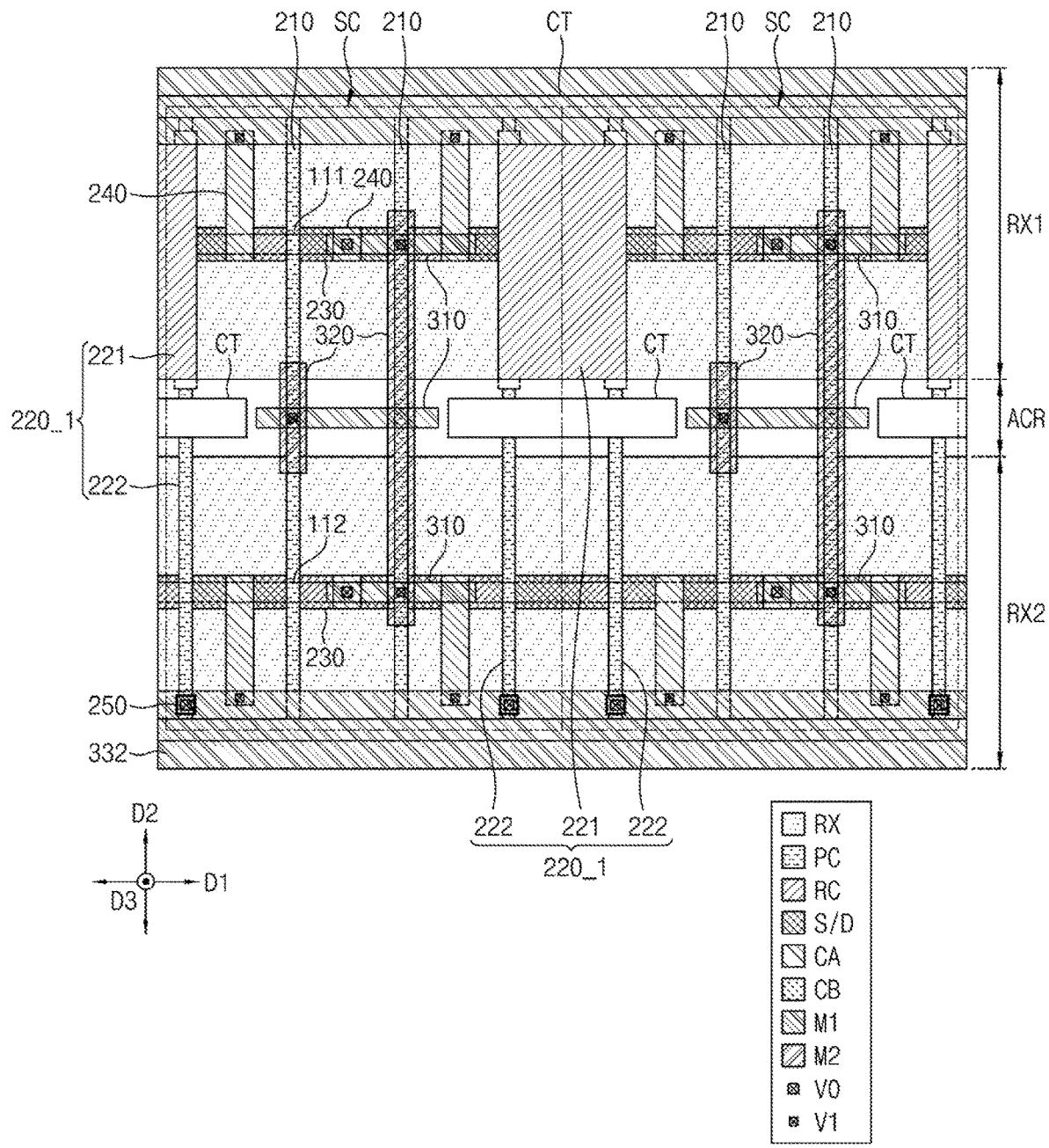
FIG. 8 is a layout view of an integrated circuit chip according to an exemplary embodiment of the disclosure.

FIG. 8 is a layout view of an integrated circuit chip according to an exemplary embodiment of the disclosure.

Referring to FIG. 8, the integrated circuit chip according to this embodiment differs from the integrated circuit chip according to the embodiment of FIG. 1 in that a diffusion break 220_1 is a double diffusion break.

In an implementation, the diffusion break 220_1 may be a double diffusion break. The diffusion break 220_1 may extend on all of two adjacent standard cells SC. In an implementation, a boundary between the two adjacent standard cells SC may be inside of (e.g., may pass through) the diffusion break 220_1.

In an implementation, one diffusion break 220_1 may include a first region 221 on a first element region RX1, and two second regions 222 on a second element region RX2. In an implementation, the first region 221 may overlap or be linearly aligned with the two second regions 222 in a second direction D2. The boundary between the two adjacent standard cells SC may extend between the two second regions 222. The boundary between the two adjacent standard cells SC may extend through the inside of the first region 221.

Figure 9:
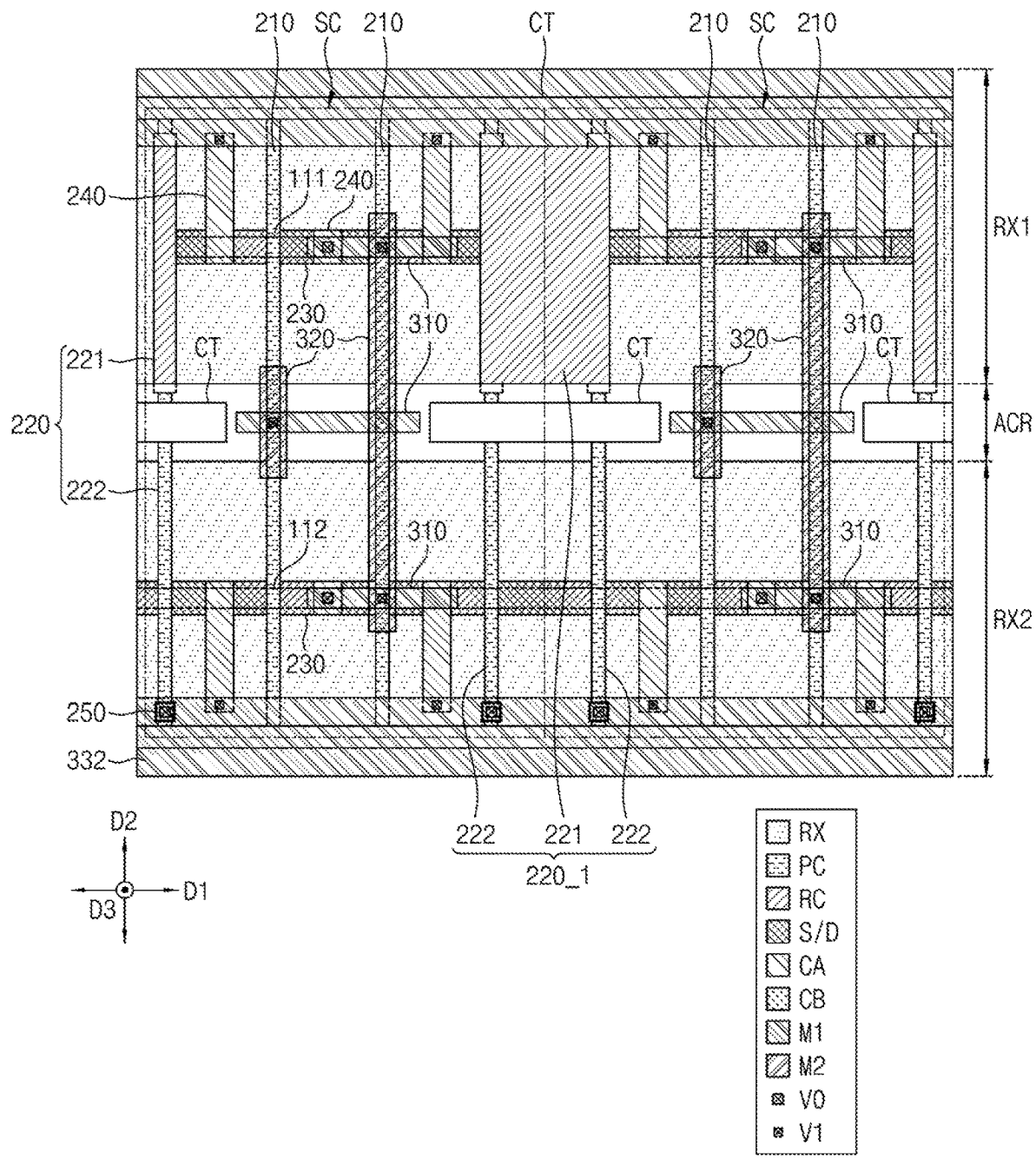
FIG. 9 is a layout view of an integrated circuit chip according to an exemplary embodiment of the disclosure.

FIG. 9 is a layout view of an integrated circuit chip according to an exemplary embodiment of the disclosure.

Referring to FIG. 9, the integrated circuit chip according to this embodiment differs from the integrated circuit chip according to each of the embodiments of FIGS. 1 and 8 in that a diffusion break 220-220_1 includes all of a single diffusion break 220 and a double diffusion break 220_1.

In an implementation, the single diffusion break 220 or the double diffusion break 220_1 may be at each boundary of adjacent standard cells SC in the integrated circuit chip. In an implementation, a first diffusion break, which is the single diffusion break 220, and a second diffusion break, which is the double diffusion break 220_1, may be alternately disposed in or along a first direction D1.

By way of summation and review, in order to obtain an integration degree of a highest level in an integrated circuit through recent semiconductor technology, a single diffusion break may be applied. The single diffusion break may isolate standard cells from each other at a boundary between the standard cells using one element and, as such, may have an advantage in that the single diffusion break achieves a reduction in area, as comparted to a double diffusion break using two elements.

In accordance with the exemplary embodiments of the disclosure, degradation of an integrated circuit chip including a standard cell may be minimized.

One or more embodiments may provide an integrated circuit chip including a standard cell capable of minimizing a reduction in mobility in an N-type channel active region and shift of a threshold voltage of a transistor while using a diffusion break (e.g., a single diffusion break).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An integrated circuit chip, comprising:
   a substrate including a first element region and a second element region respectively including wells of different types;

a first channel active region protruding from the first element region of the substrate and extending in a first direction;

a second channel active region protruding from the second element region of the substrate and extending in the first direction;

gate lines extending in a second direction intersecting the first direction and intersecting the first channel active region and the second channel active region;

a diffusion break extending in the second direction;

source/drain regions at opposite sides of each of the gate lines and on the first channel active region and the second channel active region, respectively;

a first power line electrically connected to a part of the source/drain regions; and a second power line electrically connected to another part of the source/drain regions and having a lower voltage level than the first power line, wherein the diffusion break includes:
a first region including an insulator, the first region overlapping with the first element region, and
a second region including a same material as the gate lines, the second region overlapping with the second element region, and
wherein the second region is electrically connected to the second power line.

2. The integrated circuit chip as claimed in claim 1, wherein:
the first element region is of a P type; and
the second element region is of an N type.

3. The integrated circuit chip as claimed in claim 1, wherein the first region and the second region of the diffusion break are linearly aligned in the second direction.

4. The integrated circuit chip as claimed in claim 3, wherein the first region and the second region are separated from each other by a gate cut region.

5. The integrated circuit chip as claimed in claim 1, wherein:
the first region does not overlap with the first channel active region; and
the second region includes a portion overlapping with the second channel active region.

6. The integrated circuit chip as claimed in claim 5, wherein:
the first region divides the first channel active region; and
the second region intersects the second channel active region.

7. The integrated circuit chip as claimed in claim 1, wherein the first region and the second region are in one standard cell of the integrated circuit chip.

8. The integrated circuit chip as claimed in claim 1, wherein a voltage level of the second region is a ground voltage level.

9. The integrated circuit chip as claimed in claim 1, wherein the diffusion break is at a same level as the gate lines.

10. The integrated circuit chip as claimed in claim 1, wherein the diffusion break is a single diffusion break.

11. The integrated circuit chip as claimed in claim 1, wherein:
the source/drain regions are electrically connected to the first power line through a first contact electrode and a first via; and
the second region is electrically connected to the second power line through a second contact electrode and a second via.

12. The integrated circuit chip as claimed in claim 1, wherein:
the first power line includes a portion overlapping with the first region; and
the second power line includes a portion overlapping with the second region.

13. The integrated circuit chip as claimed in claim 1, wherein a length of the first region and a length of the second region are each smaller than a length of at least one of the gate lines.

14. The integrated circuit chip as claimed in claim 1, further comprising a wire pattern extending through insides of the second region and the gate lines in the first direction, wherein the wire pattern includes a same material as the second channel active region.

15. An integrated circuit chip, comprising;
a substrate including a first element region and a second element region, which are constituted by wells of different types, respectively, and an active cut region separating the first element region and the second element region from each other;
a front-end-of-line (FEOL) structure on the substrate;
a back-end-of-line (BEOL) structure on the FEOL structure, the BEOL structure including a first power line, and a second power line having a lower voltage level than the first power line; and
bumps on the BEOL structure,
wherein the FEOL structure includes:
a first channel active region protruding from the first element region of the substrate and extending in a first direction when viewed in a plan view,
a second channel active region protruding from the second element region of the substrate and extending in the first direction,
gate lines extending in a second direction intersecting the first direction, the gate lines intersecting the first channel active region and the second channel active region,
a diffusion break extending in the second direction, and
source/drain regions at opposite sides of each of the gate lines and on the first channel active region and the second channel active region, respectively, and electrically connected to the first power line or the second power line, and
wherein the diffusion break includes:
a first region including an insulator, the first region overlapping with the first element region, and
a second region electrically connected to the second power line, the second region overlapping with the second element region.

16. The integrated circuit chip as claimed in claim 15, wherein the second region:
includes a same material as the gate lines, and
is at a same level as the gate lines.

17. The integrated circuit chip as claimed in claim 15, wherein a pitch between the diffusion break and an adjacent one of the gate lines is about equal to a pitch between adjacent ones of the gate lines.

18. The integrated circuit chip as claimed in claim 15, wherein the first region and the second region are:
physically separated from each other, and
on one virtual line extending in the second direction.

19. An integrated circuit chip including standard cells, the integrated circuit chip comprising:
a substrate including a first element region including a P-type well, a second element region including an N-type well, and an active cut region separating the first element region and the second element region from each other;

a first channel active region protruding from the first element region of the substrate and extending in a first direction;

a second channel active region protruding from the second element region of the substrate and extending in the first direction;

single diffusion breaks adjacent to boundaries of the standard cells, respectively, the single diffusion breaks extending in a second direction intersecting the first direction and overlapping with the first element region and the second element region;

gate lines between the diffusion breaks, the gate lines extending in the second direction and intersecting the first channel active region and the second channel active region;

source/drain regions at opposite sides of each of the gate lines and on the first channel active region and the second channel active region, respectively;

a first power line electrically connected to a part of the source/drain regions; and a second power line electrically connected to another part of the source/drain regions and having a lower voltage level than the first power line, wherein each of the single diffusion breaks includes:
a first region including an insulator, the first region overlapping with the first element region, and
a second region electrically connected to the second power line, the second region overlapping with the second element region and including a same material as the gate lines.

20. The integrated circuit chip as claimed in claim 19, further comprising double diffusion breaks on the boundaries of the standard cells, respectively, wherein each of the double diffusion breaks includes:
a third region including an insulator, the third region extending on the boundary of corresponding ones of the standard cells and overlapping with the first element region, and
two fourth regions including a same material as the gate lines, the two fourth regions being at different ones of the standard cells, respectively, and overlapping with the second element region, and wherein the two fourth regions overlap with the third region in the second direction.

* * * * *